(12) United States Patent
Chin et al.

(10) Patent No.: US 9,911,847 B1
(45) Date of Patent: Mar. 6, 2018

(54) NON-VOLATILE MEMORY DEVICE AND MANUFACTURING METHOD THEREOF

(71) Applicant: UNITED MICROELECTRONICS CORP., Hsin-Chu (TW)

(72) Inventors: Hock Chun Chin, Singapore (SG); Lanxiang Wang, Singapore (SG); Hong Liao, Singapore (SG); Chao Jiang, Singapore (SG); Chow Yee Lim, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/647,286

(22) Filed: Jul. 12, 2017

(51) Int. Cl.
*H01L 29/78* (2006.01)
*H01L 29/51* (2006.01)
*H01L 29/423* (2006.01)
*H01L 29/66* (2006.01)
*H01L 21/28* (2006.01)

(52) U.S. Cl.
CPC .. *H01L 29/78391* (2014.09); *H01L 21/28273* (2013.01); *H01L 21/28282* (2013.01); *H01L 21/28291* (2013.01); *H01L 29/42328* (2013.01); *H01L 29/42344* (2013.01); *H01L 29/516* (2013.01); *H01L 29/6684* (2013.01)

(58) Field of Classification Search
CPC ......... H01L 29/78391; H01L 21/28282; H01L 21/28273; H01L 21/28291; H01L 29/42344; H01L 29/42328; H01L 29/516; H01L 29/6684
See application file for complete search history.

(56) References Cited

U.S. PATENT DOCUMENTS

| 7,029,925 B2 * | 4/2006 | Celii | H01L 21/31122 257/E21.009 |
|---|---|---|---|
| 8,362,604 B2 | 1/2013 | Ionescu | |
| 8,785,995 B2 | 7/2014 | Dubourdieu | |
| 2016/0308070 A1 | 10/2016 | Chang | |

OTHER PUBLICATIONS

Tkachev, Field-Induced Generation of Electron Traps in the Tunnel Oxide of Flash Memory Cells, Integrated Reliability Workshop (IIRW), 2015 IEEE International, Oct. 2015.
Lee, Title of Invention: Multi-Threshold Voltage Semiconductor Device, U.S. Appl. No. 15/391,822, filed Dec. 27, 2016.
Hock, Title of Invention: Non-Volatile Memory Device, U.S. Appl. No. 15/631,529, filed Jun. 23, 2017.

* cited by examiner

*Primary Examiner* — William Coleman
(74) *Attorney, Agent, or Firm* — Winston Hsu (57) ABSTRACT

A non-volatile memory device includes a substrate, a gate stack structure, an erase gate structure, and a ferroelectric layer. The gate stack structure is disposed on the substrate. The erase gate structure is disposed on the substrate and disposed at a first side of the gate stack structure. The ferroelectric layer is disposed on a sidewall of the gate stack structure, and the ferroelectric layer is disposed between the gate stack structure and the erase gate structure. The ferroelectric layer disposed between the gate stack structure and the erase gate structure may be used to form a negative capacitance effect for amplifying the voltage applied to the erase gate structure. The purpose of reducing power consumption may be achieved accordingly.

20 Claims, 5 Drawing Sheets

NON-VOLATILE MEMORY DEVICE AND MANUFACTURING METHOD THEREOF

BACKGROUND OF THE INVENTION

1. Field of the Invention

The present invention relates to a memory device and a manufacturing method thereof, and more particularly, to a non-volatile memory device including a ferroelectric layer and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices depending on whether the data stored in the memory devices is completely lost or not in case of power interruption. The non-volatile memory devices, which can retain their data even when the power supply is interrupted, have been widely employed. As one kind of the non-volatile memory technology, a SONOS memory structure is to build a silicon nitride layer sandwiched between two silicon oxide layers for serving as the charge trap layer while the two silicon oxide layers respectively serve as a charge tunnel layer and a charge block layer. This oxide-nitride-oxide (ONO) multilayered structure is formed between a semiconductor substrate and a silicon gate, and thus a SONOS memory structure is constructed.

Generally, the memory cell of the non-volatile memory device described above requires high voltage operations for programming and erasing, such as higher than 10V for example. The power consumption may be an issue because of the high voltage operations. Besides, the high voltage operations have to be realized by high voltage MOS devices, and the additional processes for forming the high voltage MOS devices may induce higher manufacturing cost.

SUMMARY OF THE INVENTION

A non-volatile memory device and a manufacturing method thereof are provided by the present invention. A ferroelectric layer is disposed between a gate stack structure and an erase gate structure for forming a negative capacitance effect and lowering the required applied voltage for operating the non-volatile memory device.

According to one embodiment of the present invention, a non-volatile memory device is provided. The non-volatile memory device includes a substrate, a gate stack structure, an erase gate structure, and a ferroelectric layer. The gate stack structure is disposed on the substrate. The erase gate structure is disposed on the substrate and disposed at a first side of the gate stack structure. The ferroelectric layer is disposed on a sidewall of the gate stack structure, and the ferroelectric layer is disposed between the gate stack structure and the erase gate structure.

According to one embodiment of the present invention, a manufacturing method of a non-volatile memory device is provided. The manufacturing method includes the following steps. A gate stack structure is formed on a substrate. An erase gate structure is on the substrate, and the erase gate structure is formed at a first side of the gate stack structure. A ferroelectric layer is formed on a sidewall of the gate stack structure, and the ferroelectric layer is located between the gate stack structure and the erase gate structure.

In the non-volatile memory device of the present invention, the ferroelectric layer disposed between the gate stack structure and the erase gate structure may be used to form a negative capacitance effect, and the negative capacitance effect may be used to amplify the voltage applied to the erase gate structure. The voltage applied to the erase gate structure may be reduced, and the power consumption of the non-volatile memory device may be reduced accordingly. In addition, high voltage MOS devices for high voltage operations of the non-volatile memory may not be required, and the purposes of process simplification and manufacturing cost reduction may be achieved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating the manufacturing method of the non-volatile memory device according to the first embodiment of the present invention, wherein

DETAILED DESCRIPTION

Figure 1:
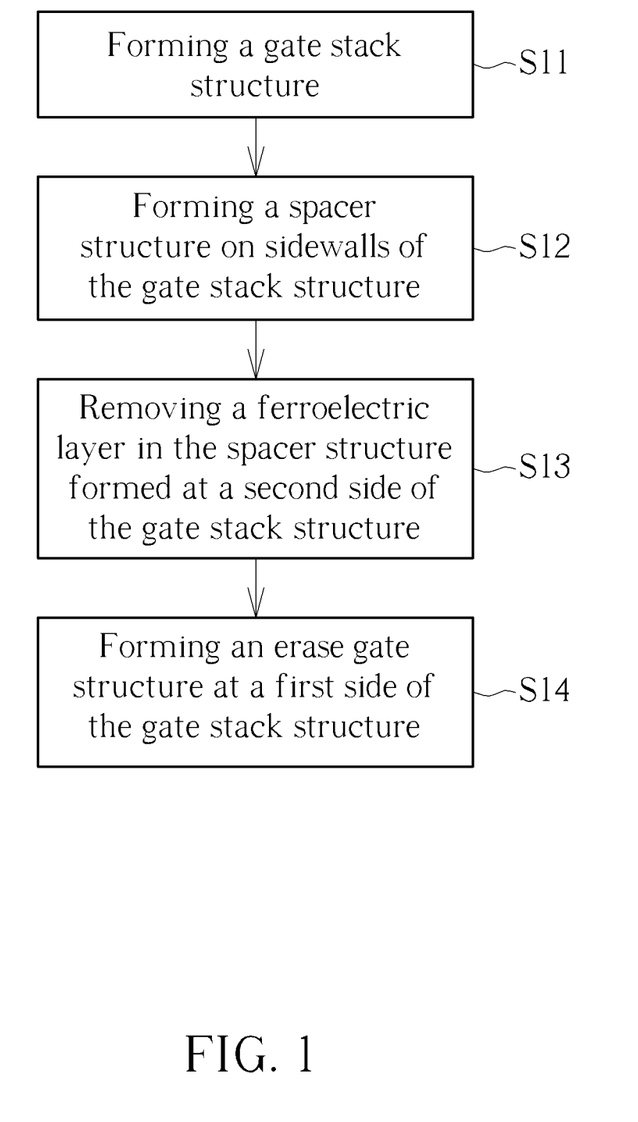
FIG. 1 is a flow chart of a manufacturing method of a non-volatile memory device according to a first embodiment of the present invention.
Figure 2:
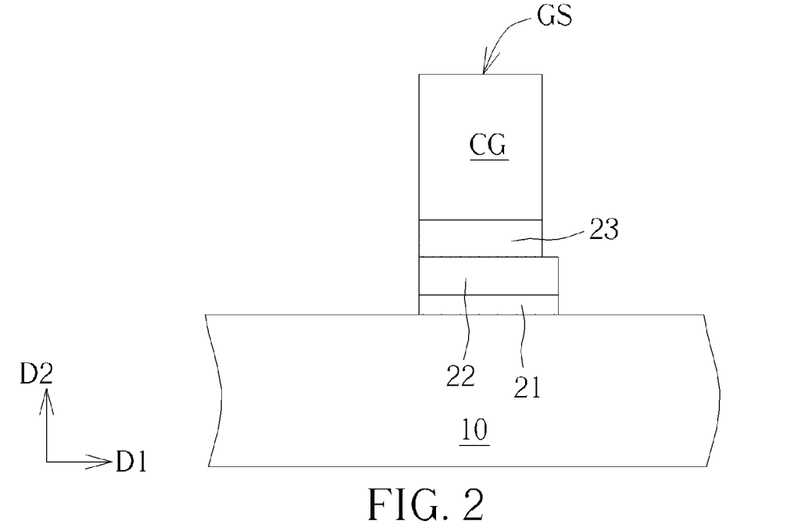

Please refer to FIG. 1 and FIGS. 2-6. FIG. 1 is a flow chart of a manufacturing method of a non-volatile memory device according to a first embodiment of the present invention, and FIGS. 2-6 are schematic drawings illustrating the manufacturing method in this embodiment. The manufacturing method of the non-volatile memory device in this embodiment includes the following steps. As shown in FIG. 1 and FIG. 2, in step S11, a gate stack structure GS is formed on a substrate 10. The substrate 10 may include a semiconductor substrate such as a silicon substrate, an epitaxial substrate, a silicon carbide substrate, or a silicon-on-insulator (SOI) substrate, but not limited thereto. In some embodiments, the gate stack structure GS may include a gate electrode CG, a charge trapping layer 22 and a first dielectric layer 23. The charge trapping layer 22 is disposed between the substrate 10 and the gate electrode CG, and the first dielectric layer 23 is disposed between the charge trapping layer 22 and the gate electrode CG. In some embodiments, the gate electrode CG may be formed by a conductive material, such as conductive polysilicon, but not limited thereto. The charge trapping layer 22 may include a floating gate, a nitride layer, or other suitable structures. The gate electrode CG and the floating gate may be formed by a conductive material, such as conductive polysilicon, but not limited thereto. The floating gate is electrically floating without being connected with any conductive line. The gate electrode CG may be regarded as a control gate of the non-volatile memory device, but not limited thereto. Additionally, the gate stack structure GS may further include a gate dielectric layer 21 disposed between the substrate 10 and the charge trapping layer 22. The gate dielectric layer 21 and the first dielectric layer 23 may include silicon oxide, silicon oxynitride, or other appropriate dielectric materials. In some embodiments, the first dielectric layer 23 may include a ferroelectric material layer. The ferroelectric material layer may include ferroelectric materials such as a perovskite oxide material or other appropriate ferroelectric materials. The perovskite oxide material may include hafnium zirconium oxide ($HfZrO_x$), barium titanate ($BaTiO_3$), lead titanate ($PbTiO_3$), lead zirconate titanate ($PbZr_xTi_{1-x}O_3$, PZT), bismuth ferrite ($BiFeO_3$), and barium strontium titanate ($Ba_xSr_{1-x}TiO_3$, BST), for example. The ferroelectric material may be formed by processes such as atomic layer deposition (ALD), epitaxial growth, and spin coating, but not limited thereto. In some embodiments, apart of the charge trapping layer 22 may not be covered by the first dielectric layer 23 in a vertical direction (such as a second direction D2 shown in FIG. 2), and the first dielectric layer 23 and the charge trapping layer 22 may be formed by different patterning processes. The second direction D2 may be regarded as a thickness direction of the substrate 10, but not limited thereto.

Figure 3:
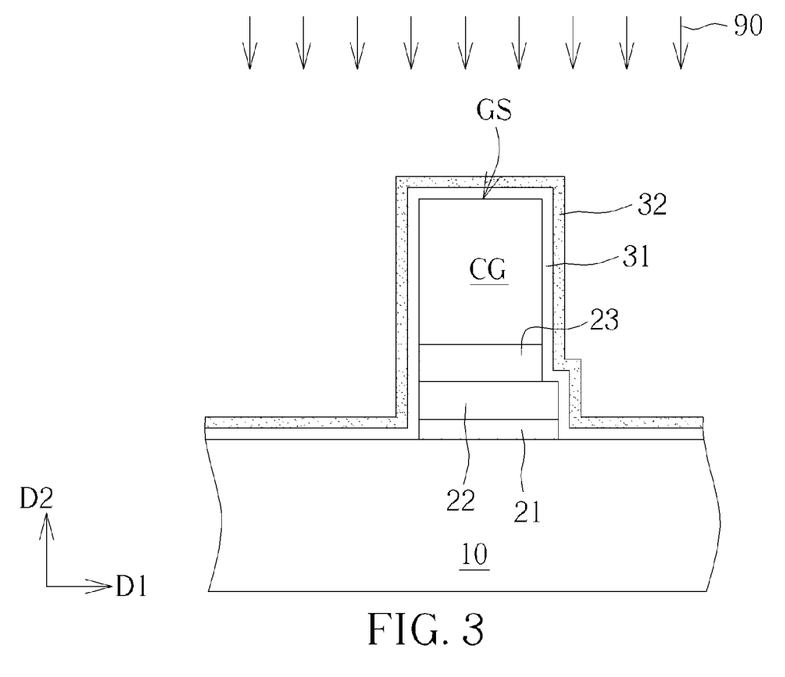
FIG. 3 is a schematic drawing in a step subsequent to FIG. 2.
Figure 4:
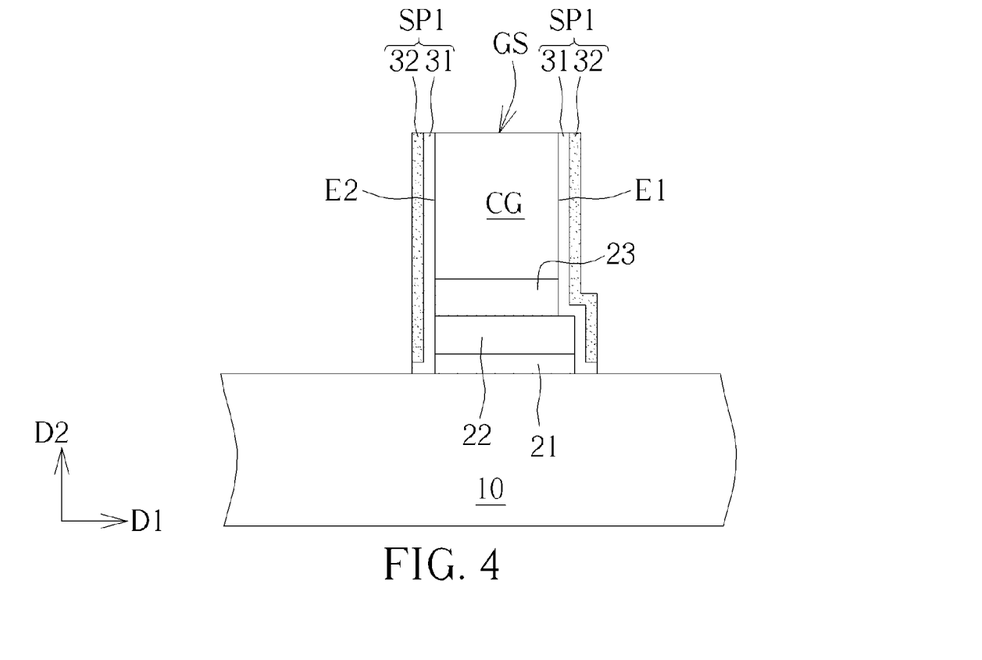
FIG. 4 is a schematic drawing in a step subsequent to FIG. 3.

As shown in FIG. 3 and FIG. 4, a ferroelectric layer 32 is formed on a sidewall of the gate stack structure GS. The method of forming the ferroelectric layer 32 may include but is not limited to the following steps. As shown in FIG. 3, before the forming the ferroelectric layer 32, a sidewall dielectric layer 31 may be conformally on the gate stack structure GS and the substrate 10, and the ferroelectric layer 32 may be conformally on the sidewall dielectric layer. Subsequently, as shown in FIG. 1, FIG. 3 and FIG. 4, in step S12, an anisotropic etching process 90 may be performed to the ferroelectric layer 32 and the sidewall dielectric layer 31 for forming a spacer structure (such as a first spacer structure SP1 shown in FIG. 4) on the sidewall of the gate stack structure GS. In other words, the first spacer structure SP1 includes the ferroelectric layer 32 and the sidewall dielectric layer 31. In some embodiments, the sidewall dielectric layer 31 may include silicon oxide, silicon oxynitride, or other appropriate dielectric materials. The ferroelectric layer 32 may include ferroelectric materials such as a perovskite oxide material or other appropriate ferroelectric materials, and the perovskite oxide material may include hafnium zirconium oxide, barium titanate, lead titanate, lead zirconate titanate, bismuth ferrite, and barium strontium titanate, for example. In other words, when the first dielectric layer 23 is a ferroelectric material layer, the material of the first dielectric layer 23 may be the same as the material of the ferroelectric layer 32, but not limited thereto. In some embodiments, the ferroelectric material of the first dielectric layer 23 may also be different from the material of the ferroelectric layer 32. The first spacer structure SP1 composed of the sidewall dielectric layer 31 and the ferroelectric layer 32 may be formed at two opposite sides of the gate stack structure GS in a horizontal direction (such as a first direction D1 shown in FIG. 4). For example, apart of the first spacer structure SP1 may be formed at a first side E1 of the gate stack structure GS and another part of the first spacer structure SP1 may be formed at a second side E2 of the gate stack structure GS, and the second side E2 is different from and opposite to the first side E1 in the first direction D1.

Figure 5:
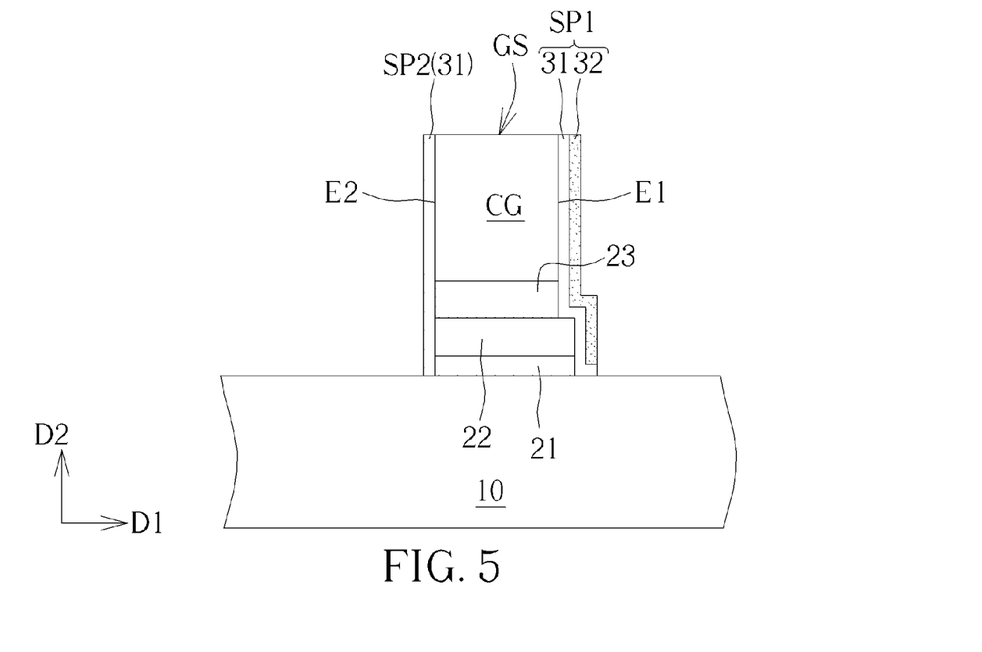
FIG. 5 is a schematic drawing in a step subsequent to FIG. 4.

As shown in FIG. 1, FIG. 4, and FIG. 5, in step S13, the ferroelectric layer 32 in the first spacer structure SP1 disposed at the second side E2 of the gate stack structure GS is removed. The sidewall dielectric layer 31 formed at the second side E2 of the gate stack structure GS may remain after the step of removing the ferroelectric layer 32 formed at the second side E2, and the sidewall dielectric layer 31 located at the second side E2 may be regarded as a second spacer structure SP2 having a constitution different from that of the first spacer structure SP1.

Figure 6:
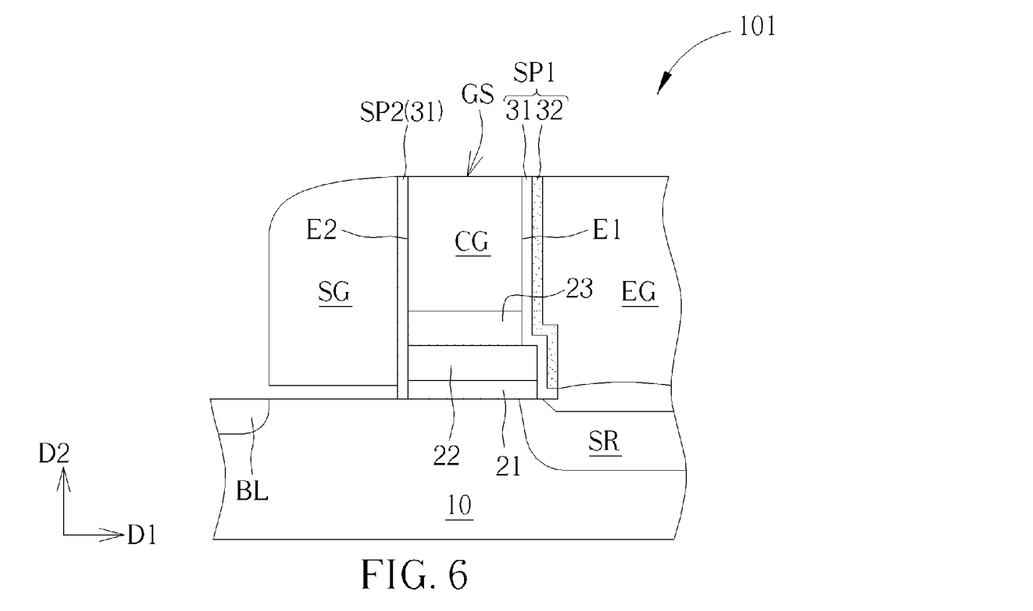
FIG. 6 is a schematic drawing in a step subsequent to FIG. 5.

As shown in FIG. 1 and FIG. 6, an erase gate structure EG is formed on the substrate 10. The erase gate structure EG is formed at the first side E1 of the gate stack structure GS, and the ferroelectric layer 32 is located between the gate stack structure GS and the erase gate structure EG. In some embodiments, the manufacturing method may further include forming a select gate structure SG on the substrate 10 and forming a bit line region BL and a source region SR in the substrate 10. The select gate structure SG is formed at the second side E2 of the gate stack structure GS after the step of removing the ferroelectric layer 32 in the first spacer structure SP1 disposed at the second side E2 of the gate stack structure GS. In some embodiments, the select gate structure SG may directly contact the sidewall dielectric layer 31 formed at the second side E2 of the gate stack structure GS, but not limited thereto. In some embodiments, other dielectric layer may be formed between the sidewall dielectric layer 31 and the select gate structure SG according to other design considerations. The bit line region BL may be formed at an outer side of the select gate structure SG, and the source region SR may be partly formed underneath the erase gate structure EG and partly formed underneath the gate stack structure GS in the second direction D2, but not limited thereto. In some embodiments, the erase gate structure EG and the select gate structure SG may be formed by a conductive material, such as conductive polysilicon, but not limited thereto.

As shown in FIG. 6, a non-volatile memory device 101 may be formed by the manufacturing steps described above. The non-volatile memory device 101 may include the substrate 10, the gate stack structure GS, the erase gate structure EG, and the ferroelectric layer 32. The gate stack structure GS is disposed on the substrate 10. The erase gate structure EG is disposed on the substrate 10 and disposed at the first side E1 of the gate stack structure GS. The ferroelectric layer 32 is disposed on the sidewall of the gate stack structure GS, and the ferroelectric layer 32 is disposed between the gate stack structure GS and the erase gate structure EG. The gate stack structure GS may include the gate dielectric layer 21, the charge trapping layer 22, the first dielectric layer 23, and the gate electrode CG sequentially stacked on the substrate 10. In some embodiments, the non-volatile memory device 101 may further include the sidewall dielectric layer 31 disposed on the sidewall of the gate stack structure GS. The sidewall dielectric layer 31 may be at least disposed at the first side E1 the gate stack structure GS, and the sidewall dielectric layer 31 disposed at the first side E1 may be disposed between the ferroelectric layer 32 and the gate stack structure GS. In some embodiments, the sidewall dielectric layer 31 may be further disposed at the second side E2 of the gate stack structure GS, and the second side E2 is different from and opposite to the first side E1 in the first direction D1. In addition, the non-volatile memory device 101 may further include the select gate structure SG, the bit line region BL, and the source region SR. The select gate structure SG is disposed on the substrate 10 and disposed at the second side E2 of the gate stack structure GS. In some embodiments, the sidewall dielectric layer 31 disposed at the second side E2 of the gate stack structure GS may be disposed between the select gate structure SG and the gate stack structure GS. Additionally, the sidewall dielectric layer 31 disposed at the second side E2 of the gate stack structure GS may directly contact the select gate structure SG and the gate stack structure GS, but not limited thereto.

In some embodiments, the non-volatile memory device 101 may be operated by applying signals to the gate electrode CG, the erase gate structure EG, the select gate structure SG, the bit line region BL, and/or the source region SR. For example, in a programming operation, a voltage may be applied to the select gate structure SG, a current may be applied to the bit line region BL, another voltage may be applied to the gate electrode CG, and a relatively low voltage may be applied to the erase gate structure EG and the source region SR respectively for making charges enter the charge trapping layer 22 from the substrate 10. In an erasing operation, the select gate structure SG, the bit line region BL, the source region SR, and the gate electrode CG may not be applied voltages, and a relatively high voltage may be applied to the erase gate structure EG only for removing the charges stored in the charge trapping layer. The ferroelectric layer 32 disposed between the gate stack structure GS and the erase gate structure EG may be used to form a negative capacitance effect, and the negative capacitance effect may be used to amplify the voltage applied to the erase gate structure EG. Accordingly, the voltage applied to the erase gate structure EG may be reduced, and the power consumption of the non-volatile memory device 101 may be reduced. For example, an equation (1) listed below may be used to calculate the amplification of the ferroelectric layer 32 on the erase gate structure EG.

$$Av = \frac{C_{FE}}{|C_{FE}| - C_X} \quad (1)$$

In the equation (1), $C_{FE}$ stands for a capacitance of the ferroelectric layer 32, $C_x$ stands for a capacitance of the sidewall dielectric layer 31, and Av stands for an amplification coefficient. According to the equation (1), the capacitance of the ferroelectric layer 32 may be controlled for generating required amplification effect. For example, the amplification coefficient of the ferroelectric layer 32 may be 460% when the ferroelectric layer 32 is a PZT later and the thickness of the ferroelectric layer 32 is controlled in a specific range, and the voltage applied to the erase gate structure EG may be reduced from 11.5V to about 2.5V in the erasing operation. Similarly, in some embodiments, the first dielectric layer 23 may be a ferroelectric material layer for forming a negative capacitance effect and amplifying the voltage applied to the gate electrode CG. For example, when the amplification coefficient of the first dielectric layer 23 is about 460%, and the voltage applied to the gate electrode CG may also be reduced from 11.5V to about 2.5V in the programming operation. Accordingly, for the non-volatile memory device 101, high voltage circuits for high voltage operations of the non-volatile memory may not be required, and the purposes of process simplification and manufacturing cost reduction may be achieved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
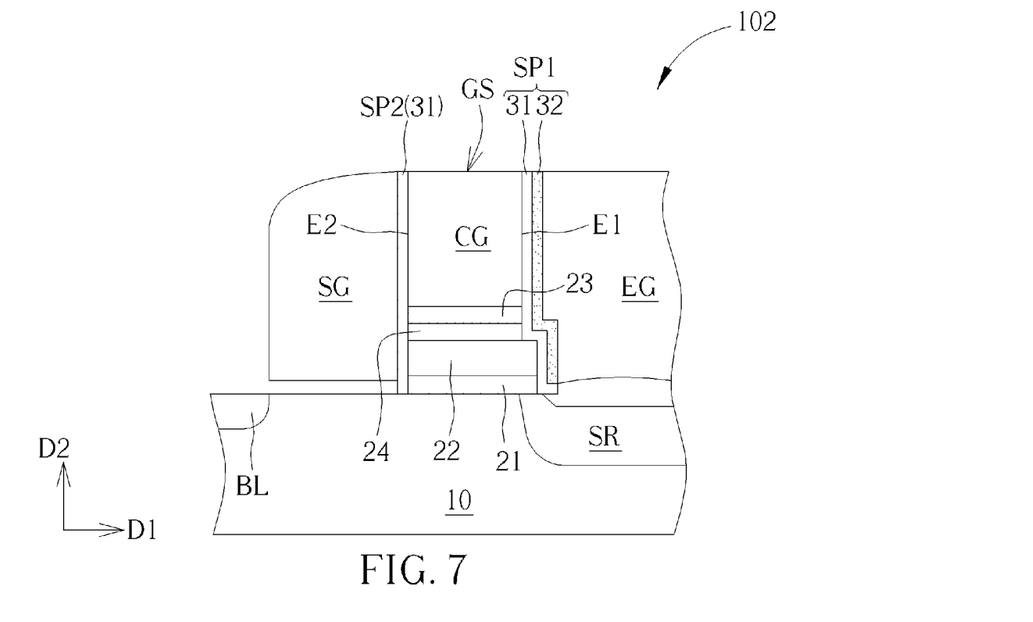
FIG. 7 is a schematic drawing illustrating a non-volatile memory device according to a second embodiment of the present invention.

Please refer to FIG. 7. FIG. 7 is a schematic drawing illustrating a non-volatile memory device 102 according to a second embodiment of the present invention. As shown in FIG. 7, the difference between this embodiment and the first embodiment mentioned above is that the gate stack structure GS in the non-volatile memory device 102 may further include a second dielectric layer 24 disposed between the charge trapping layer 22 and the first dielectric layer 23, and the material of the second dielectric layer 24 may be different from the material of the first dielectric layer 23. For example, in some embodiments, the second dielectric layer 24 may be an oxide layer, the charge trapping layer 22 may be a nitride layer, and the gate dielectric layer 21 may be an oxide layer for forming an oxide-nitride-oxide (ONO) multiple layer structure, but not limited thereto.

Figure 8:
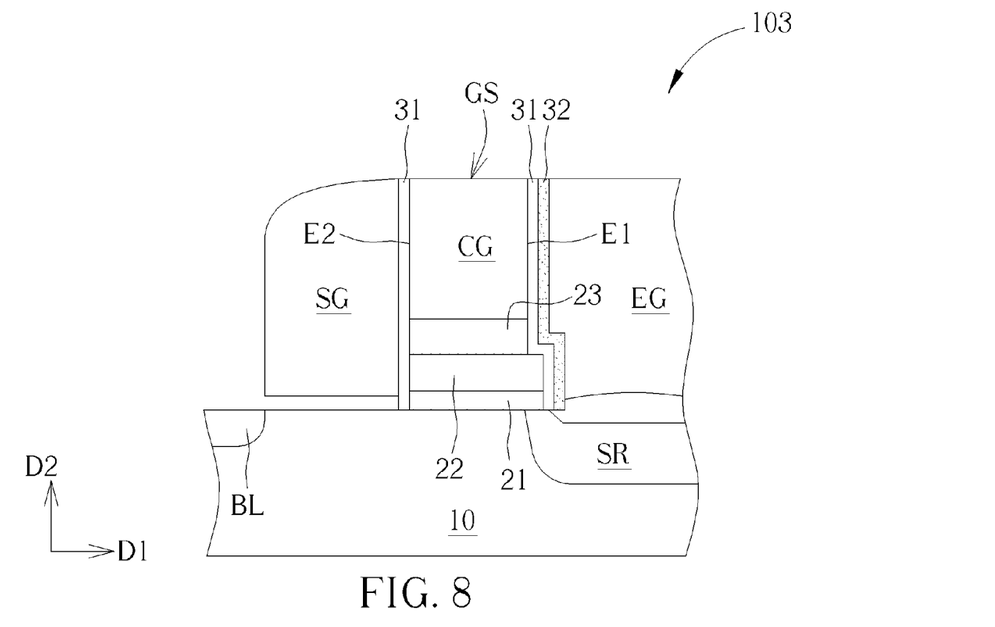
FIG. 8 is a schematic drawing illustrating a non-volatile memory device according to a third embodiment of the present invention.

Please refer to FIG. 8. FIG. 8 is a schematic drawing illustrating a non-volatile memory device 103 according to a third embodiment of the present invention. As shown in FIG. 8, the difference between this embodiment and the first embodiment mentioned above is that the spacer structure composed of the sidewall dielectric layer 31 may be formed before the step of forming the ferroelectric layer 32. In other words, the sidewall dielectric layer 31 and the ferroelectric layer 32 may be patterned by different processes.

Figure 9:
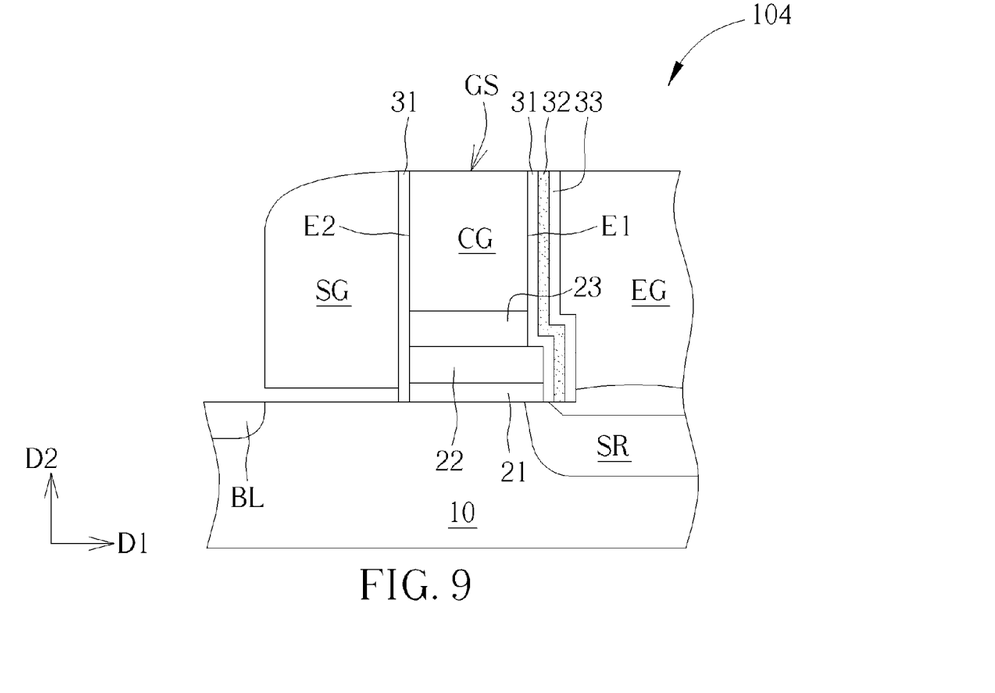
FIG. 9 is a schematic drawing illustrating a non-volatile memory device according to a fourth embodiment of the present invention.

Please refer to FIG. 9. FIG. 9 is a schematic drawing illustrating a non-volatile memory device 104 according to a fourth embodiment of the present invention. As shown in FIG. 9, the difference between this embodiment and the fourth embodiment mentioned above is that the non-volatile memory device 104 may further include a third dielectric layer 33 disposed between the ferroelectric layer 32 and the erase gate structure EG. The third dielectric layer 33 may include silicon oxide, silicon oxynitride, or other appropriate dielectric materials. In other words, the manufacturing method of the non-volatile memory device 104 may further include forming the third dielectric layer 33 on the ferroelectric layer 32, and the third dielectric layer 33 may be located between the ferroelectric layer 32 and the erase gate structure EG. In some embodiments, the third dielectric layer 33 may be further formed at the second side of the gate stack structure GS and be located between the select gate structure SG and the gate stack structure GS.

To summarize the above descriptions, according to the non-volatile memory device and the manufacturing method thereof in the present invention, the ferroelectric layer formed between the gate stack structure and the erase gate structure may be used to form a negative capacitance effect for amplifying the voltage applied to the erase gate structure in the erase operation of the non-volatile memory device. In addition, the first dielectric layer disposed between the gate electrode and the charge trapping layer may also include a ferroelectric material for forming a negative capacitance effect and amplifying the voltage applied to the gate electrode in the programming operation of the non-volatile memory device. The voltage applied to the erase gate structure and/or the gate structure may be reduced, and the power consumption of the non-volatile memory device may be reduced accordingly. Additionally, high voltage circuits for high voltage operations of the non-volatile memory will not be required because of the negative capacitance effect provided by the ferroelectric material disposed between the gate electrode and the erase gate structure and/or the ferroelectric material disposed between the gate electrode and the charge trapping layer. Accordingly, the purposes of process simplification and manufacturing cost reduction may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising:
   a substrate;
   a gate stack structure disposed on the substrate;
   an erase gate structure disposed on the substrate and disposed at a first side of the gate stack structure; and
   a ferroelectric layer disposed on a sidewall of the gate stack structure, wherein the ferroelectric layer is disposed between the gate stack structure and the erase gate structure.

2. The non-volatile memory device according to claim 1, wherein the gate stack structure comprises:
   a gate electrode;
   a charge trapping layer disposed between the substrate and the gate electrode; and
   a first dielectric layer disposed between the charge trapping layer and the gate electrode.

3. The non-volatile memory device according to claim 1, further comprising:
   a sidewall dielectric layer disposed on the sidewall of the gate stack structure, wherein the sidewall dielectric layer is at least disposed at the first side of the gate stack structure, and the sidewall dielectric layer disposed at the first side of the gate stack structure is disposed between the ferroelectric layer and the gate stack structure.

4. The non-volatile memory device according to claim 1, further comprising a third dielectric layer disposed between the ferroelectric layer and the erase gate structure.

5. The non-volatile memory device according to claim 2, wherein the first dielectric layer comprises a ferroelectric material layer.

6. The non-volatile memory device according to claim 2, wherein the charge trapping layer comprises a floating gate or a nitride layer.

7. The non-volatile memory device according to claim 2, wherein the gate stack structure further comprises a second dielectric layer disposed between the charge trapping layer and the first dielectric layer, and the material of the second dielectric layer is different from the material of the first dielectric layer.

8. The non-volatile memory device according to claim 3, wherein the sidewall dielectric layer is further disposed at a second side of the gate stack structure, and the second side is opposite to the first side.

9. The non-volatile memory device according to claim 8, further comprising:
   a select gate structure disposed on the substrate and disposed at the second side of the gate stack structure, wherein the sidewall dielectric layer disposed at the second side of the gate stack structure is disposed between the select gate structure and the gate stack structure.

10. The non-volatile memory device according to claim 9, wherein the sidewall dielectric layer disposed at the second side of the gate stack structure directly contacts the select gate structure and the gate stack structure.

11. A manufacturing method of a non-volatile memory device, comprising:
    forming a gate stack structure on a substrate;
    forming an erase gate structure on the substrate, wherein the erase gate structure is formed at a first side of the gate stack structure; and
    forming a ferroelectric layer on a sidewall of the gate stack structure, wherein the ferroelectric layer is located between the gate stack structure and the erase gate structure.

12. The manufacturing method of the non-volatile memory device according to claim 11, wherein the gate stack structure comprises:
    a gate electrode;
    a charge trapping layer disposed between the substrate and the gate electrode; and
    a first dielectric layer disposed between the charge trapping layer and the gate electrode.

13. The manufacturing method of the non-volatile memory device according to claim 12, wherein the first dielectric layer comprises a ferroelectric material layer.

14. The manufacturing method of the non-volatile memory device according to claim 12, wherein the charge trapping layer comprises a floating gate or a nitride layer.

15. The manufacturing method of the non-volatile memory device according to claim 12, wherein the gate stack structure further comprises a second dielectric layer disposed between the charge trapping layer and the first dielectric layer, and the material of the second dielectric layer is different from the material of the first dielectric layer.

16. The manufacturing method of the non-volatile memory device according to claim 11, further comprising:
    forming a third dielectric layer on the ferroelectric layer, wherein the third dielectric layer is located between the ferroelectric layer and the erase gate structure.

17. The manufacturing method of the non-volatile memory device according to claim 11, wherein the step of forming the ferroelectric layer comprises:
    forming a sidewall dielectric layer conformally on the gate stack structure and the substrate;
    forming the ferroelectric layer conformally on the sidewall dielectric layer; and
    performing an anisotropic etching process to the ferroelectric layer and the sidewall dielectric layer for forming a spacer structure on the sidewall of the gate stack structure, wherein the spacer structure comprises the ferroelectric layer and the sidewall dielectric layer.

18. The manufacturing method of the non-volatile memory device according to claim 17, wherein the spacer structure is formed at the first side and a second side of the gate stack structure, and the second side is opposite to the first side.

19. The manufacturing method of the non-volatile memory device according to claim 18, further comprising:
    removing the ferroelectric layer in the spacer structure disposed at the second side of the gate stack structure.

20. The manufacturing method of the non-volatile memory device according to claim 19, further comprising:
    forming a select gate structure on the substrate and at the second side of the gate stack structure after the step of removing the ferroelectric layer in the spacer structure disposed at the second side of the gate stack structure, wherein the select gate structure directly contacts the sidewall dielectric layer formed at the second side of the gate stack structure.

* * * * *